US009202854B2

(12) United States Patent
Song et al.

(10) Patent No.: US 9,202,854 B2
(45) Date of Patent: Dec. 1, 2015

(54) ARRAY SUBSTRATE, MANUFACTURING METHOD THEREOF AND OLED DISPLAY DEVICE

(71) Applicant: BOE TECHNOLOGY GROUP CO., LTD., Beijing (CN)

(72) Inventors: Young Suk Song, Beijing (CN); Seong Yeol Yoo, Beijing (CN); Seung Jin Choi, Beijing (CN); Hee Cheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/100,801

(22) Filed: Dec. 9, 2013

(65) Prior Publication Data

US 2014/0159010 A1 Jun. 12, 2014

(30) Foreign Application Priority Data

Dec. 12, 2012 (CN) .......................... 2012 1 0536938

(51) Int. Cl.
| | |
|---|---|
| *H01L 35/24* | (2006.01) |
| *H01L 27/32* | (2006.01) |
| *H01L 27/12* | (2006.01) |
| *H01L 51/56* | (2006.01) |

(52) U.S. Cl.
CPC ........ *H01L 27/3276* (2013.01); *H01L 27/1255* (2013.01); *H01L 27/3265* (2013.01); *H01L 51/56* (2013.01); *H01L 2227/323* (2013.01)

(58) Field of Classification Search
CPC .. H01L 21/775; H01L 27/12; H01L 29/66757
USPC ............................................... 257/40, 71, 72
See application file for complete search history.

(56) References Cited

U.S. PATENT DOCUMENTS

| | | | | |
|---|---|---|---|---|
| 6,870,192 | B2 * | 3/2005 | Yamazaki et al. | ............... 257/79 |
| 2007/0109453 | A1 | 5/2007 | Kaneko et al. | |
| 2007/0263164 | A1 | 11/2007 | Kumagai | |
| 2011/0074749 | A1 | 3/2011 | Higashi | |
| 2012/0211750 | A1 | 8/2012 | Kakinuma | |

FOREIGN PATENT DOCUMENTS

| | | |
|---|---|---|
| EP | 1850386 A1 | 10/2007 |
| EP | 1865371 A1 | 12/2007 |

OTHER PUBLICATIONS

Extended European search report issued by the European Patent Office dated Mar. 18, 2014 for patent application No. 13196455.3, 8 pages.
Second Office Action (Chinese Language) from State Intellectual Property Office of the People's Republic of China in CN201210536938.6, issued Mar. 9, 2015; 11 pages.
English translation of Second Office Action from State Intellectual Property Office of the People's Republic of China in CN201210536938.6, issued Mar. 9, 2015; 12 pages.

* cited by examiner

*Primary Examiner* — Quoc Hoang
(74) *Attorney, Agent, or Firm* — Ladsa & Parry LLP

(57) ABSTRACT

An array substrate, a manufacturing method thereof and an OLED display device are provided. The array substrate comprises a plurality of pixel units disposed on a substrate, wherein each pixel unit includes a TFT structure formed on the substrate and an OLED driven by the TFT structure; the TFT structure includes a drive TFT. A drain electrode of the drive TFT is connected with the OLED; a gate electrode and the drain electrode of the drive TFT are at least partially overlapped to form a storage capacitor. A recess is formed in an insulating layer interposed between the gate electrode and the drain electrode corresponding to the overlapped area, so that the distance between the gate electrode and the drain electrode is less than the thickness of the insulating layer corresponding to the non-overlapped area.

15 Claims, 3 Drawing Sheets

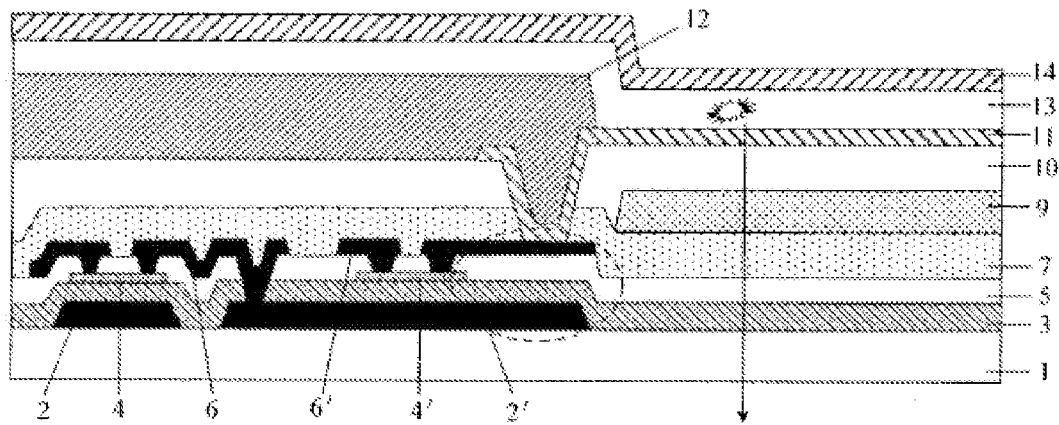
FIG. 1 - Prior Art
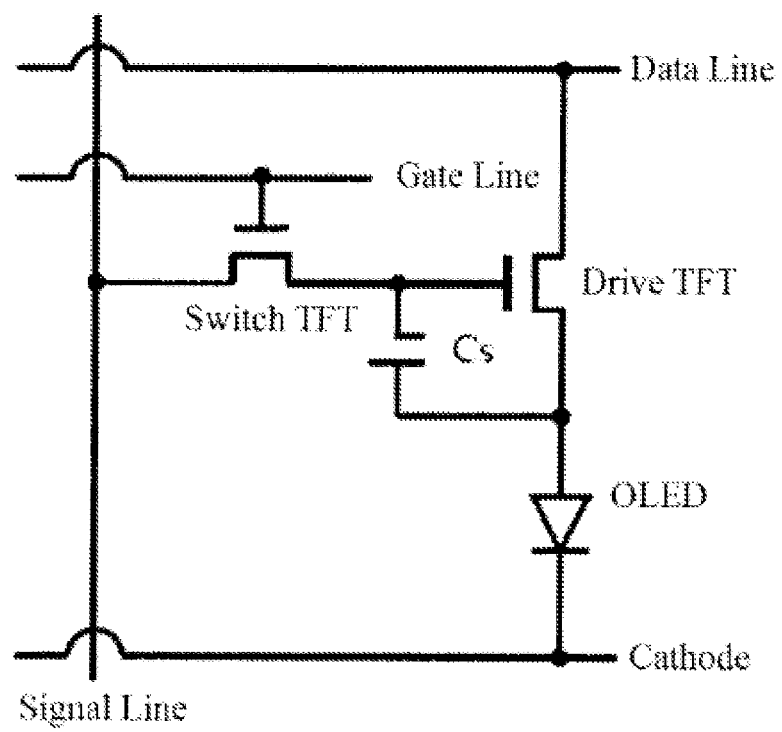
FIG. 2 - Prior Art

ARRAY SUBSTRATE, MANUFACTURING METHOD THEREOF AND OLED DISPLAY DEVICE

CROSS REFERENCE TO RELATED APPLICATIONS

This application claims priority from Chinese National Application No. 201210536938.6 filed on Dec. 12, 2012, the contents of which are incorporated herein by reference.

BACKGROUND

Embodiments of the present invention relate to an array substrate, a manufacturing method thereof and an organic light-emitting diode (OLED) display device.

OLED is considered to be one of the most important display technologies in the future due to the advantages of simple manufacturing process, low cost, free adjustment of emission colors within visible regions, large scale, flexible bending and the like. More particularly, the power efficiency of a white OLED (WOLED) has exceeded 60 lm/W and the service life of the WOLED has reached 20,000 hours or more, greatly promoting the development of the WOLED.

FIG. 1 is a schematic structural view of the traditional OLED array substrate, which specifically illustrates a structure of a pixel unit. The structure comprises (from bottom to top): a first gate electrode 2, a second gate electrode 2' and gate lines (not illustrated in the figure) formed on a substrate 1, a gate insulating layer 3 formed on the first gate electrode 2, the second gate electrode 2' and the gate lines, a first active layer 4 and a second active layer 4' formed on the gate insulating layer 3, an insulating interlayer 5 formed on the first active layer 4 and the second active layer 4', a first source-drain layer 6 (including a first source electrode and a first drain electrode) and a second source-drain layer 6' (including a second source electrode and a second drain electrode) formed on the insulating interlayer 5, and a passivation layer 7 formed on the first source-drain layer 6 and the second source-drain layer 6'. The first gate electrode 2, the gate insulating layer 3, the first active layer 4, the insulating interlayer 5 and the first source-drain layer 6 constitute a switch thin-film transistor (switch TFT); the second gate electrode 2', the gate insulating layer 3, the second active layer 4', the insulating interlayer 5 and the second source-drain layer 6' constitute a drive thin-film transistor (drive TFT). The passivation layer 7, a color filter 9, a resin layer 10, a first electrode 11 of an OLED, a pixel defining layer 12, an organic emission layer 13, and a second electrode 14 of the OLED are disposed above the first source-drain layer 6 and the second source-drain layer 6' in sequence. The first electrode 11 is a transparent electrode, and light emitted by the organic emission layer is emitted after running through the first electrode and various layers under the first electrode. The OLED is disposed in a pixel region of the pixel unit (in general, a display area of the pixel unit, except for a TFT).

In the structure, as illustrated by dotted lines in FIG. 1, a storage capacitor is formed between the second gate electrode 2' and the second source-drain layer 6'. An equivalent circuit diagram of the pixel unit is as illustrated in FIG. 2, in which Cs refers to the storage capacitor. As the WOLED requires a large driving current, a WOLED display device has large power consumption. In order to reduce the power consumption, a structure of the storage capacitor is formed on the substrate. The storage capacitor has the function of supplying one part of driving current for the WOLED in such a way that the driving current supplied by an electric power source can be correspondingly reduced, and hence the power consumption can be reduced. However, it can be seen from FIG. 1 that as two insulating layers are interposed between the second gate electrode 2' and the drain electrode of the second source-drain layer 6', the distance is large and the capacitance is small.

SUMMARY

One embodiment of the present invention provides an array substrate, comprising a plurality of pixel units disposed on a substrate, each pixel unit comprising a thin-film transistor (TFT) structure formed on the substrate and an organic light-emitting diode (OLED) driven by the TFT structure, the TFT structure comprising a drive TFT, wherein a drain electrode of the drive TFT is connected with the OLED; a gate electrode and the drain electrode of the drive TFT are at least partially overlapped to form a storage capacitor; and a recess is formed in an insulating layer interposed between the gate electrode and the drain electrode corresponding to an overlapped area of the gate electrode and the drain electrode of the drive TFT, so that a distance between the gate electrode and the drain electrode is less than a thickness of a part of the insulating layer in an area other than the non-overlapped area.

In one example, the drain electrode is disposed over the gate electrode; and a part of the drain electrode is formed in the recess.

In one example, the TFT structure comprises: a first gate electrode and a second gate electrode formed on the substrate, a gate insulating layer formed on the first gate electrode and the second gate electrode, a first active layer and a second active layer formed on the gate insulating layer, a first source electrode and a first drain electrode formed on the first active layer, and a second source electrode and a second drain electrode formed on the second active layer; the first drain electrode is connected with the second gate electrode; the first gate electrode, the gate insulating layer, the first active layer, the first source electrode and the first drain electrode constitute a switch TFT; and the second gate electrode, the gate insulating layer, the second active layer, the second source electrode and the second drain electrode constitute the drive TFT; and the OLED is disposed in a pixel region of the pixel unit and comprises a transparent first electrode, an emission layer and a second electrode; the first electrode is connected with the second drain electrode; the second drain electrode and the second gate electrode are at least partially overlapped to form the storage capacitor; and the insulating layer interposed between the second drain electrode and the second gate electrode comprises the gate insulating layer.

In one example, an insulating interlayer is further formed between the second active layer and the second drain electrode; the insulating layer comprises the insulating interlayer and the gate insulating layer; the recess is formed in a surface of the insulating interlayer close to the second drain electrode; and the depth of the recess is less than the thickness of the insulating interlayer.

In one example, an insulating interlayer is further formed between the second active layer and the second drain electrode; the insulating layer comprises the insulating interlayer and the gate insulating layer; a through hole is formed in the insulating interlayer corresponding to the overlapped area; and the through hole and a surface of the gate insulating layer form the recess.

In one example, an insulating interlayer is further formed between the second active layer and the second drain electrode; the insulating layer comprises the insulating interlayer and the gate insulating layer; a through hole is formed in the insulating interlayer corresponding to the overlapped area; a sub-recess is formed in the gate insulating layer corresponding to the overlapped area; the through hole and the sub-recess form the recess; and the depth of the sub-recess is less than the thickness of the gate insulating layer.

In one example, the pixel unit further comprises: a color filter formed between a layer provided with the OLED and a layer provided with the TFT structure.

In one example, the color filter is disposed on a passivation layer above the drive TFT.

Another embodiment of the invention provides a method for manufacturing an array substrate, comprising the following steps of: forming patterns of a first gate electrode, a second gate electrode, an insulating layer, a first active layer and a second active layer on a substrate; forming patterns of a through hole and a recess in the insulating layer; forming patterns of a first source electrode, a first drain electrode, a second source electrode and a second drain electrode in such a way that the second drain electrode and the second gate electrode are at least partially overlapped and an overlapped area of the second drain electrode and the second gate electrode corresponds to the recess, so that a distance between the second gate electrode and the second drain electrode is less than the thickness of a part of the insulating layer in an area other than the non-overlapped area; and forming patterns of a color filter and an OLED.

In one example, the insulating layer comprises a gate insulating layer; and forming the patterns of the through hole and the recess in the insulating layer comprises: by patterning process, forming the through hole in the gate insulating layer corresponding to a connection area of the first drain electrode and the second gate electrode, and forming the recess in the gate insulating layer corresponding to the overlapped area of the second drain electrode and the second gate electrode.

In one example, the insulating layer comprises a gate insulating layer formed on the first gate electrode and the second gate electrode and an insulating interlayer formed on the first active layer and the second active layer; and the patterns of the through hole and the recess are formed in the insulating layer by one patterning process.

In one example, forming the patterns of the through hole and the recess in the insulating layer comprises: by patterning process, forming a first through hole running through the gate insulating layer and the insulating interlayer at a connection area of the first drain electrode and the second gate electrode; forming a second through hole running through the insulating interlayer at a connection area of the first source electrode and the first active layer; forming a third through hole running through the insulating interlayer at a connection area of the first drain electrode and the first active layer; forming a fourth through hole running through the insulating interlayer at a connection area of the second source electrode and the second active layer; and forming the recess at the overlapped area of the second drain electrode and the second gate electrode.

In one example, forming the recess at the overlapped area of the second drain electrode and the second gate electrode comprises: forming the recess in the insulating interlayer corresponding to the overlapped area; or, forming a through hole in the insulating interlayer corresponding to the overlapped area, and the through hole and a surface of the gate insulating layer forming the recess; or, forming a through hole at the corresponding overlapped area on the insulating interlayer, forming a sub-recess in the gate insulating layer corresponding to overlapped area, and the through hole and the sub-recess forming the recess.

Another embodiment of the present invention provides an OLED display device, which comprises the array substrate according to any embodiment of the present invention.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1 is a schematic structural view of a traditional array substrate;

FIG. 2 is an equivalent circuit diagram of a pixel unit in the array substrate in FIG. 1;

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The array substrate provided by the present invention comprises a plurality of pixel units disposed on a substrate, wherein each pixel unit includes a TFT structure formed on the substrate and an OLED driven by the TFT structure and disposed in a pixel region of the pixel unit. In addition, the TFT structure includes a drive TFT, wherein a drain electrode of the drive TFT is connected with the OLED; a gate electrode and the drain electrode of the drive TFT are at least partially overlapped to form a storage capacitor; and a recess is formed an insulating layer interposed between the gate electrode and the drain electrode corresponding to an overlapped area of the gate electrode and the drain electrode of the drive TFT, so that the distance between the gate electrode and the drain electrode is less than the thickness of a part of the insulating layer corresponding to the non-overlapped area (in an area other than the overlapped area). The structure reduces the distance between the gate electrode and the drain electrode and hence increases the storage capacitance formed between the gate electrode and the drain electrode and reduces the driving power of the array substrate. Description will be given below by taking a bottom-gate TFT WOLED array substrate as an example.

Figure 3:
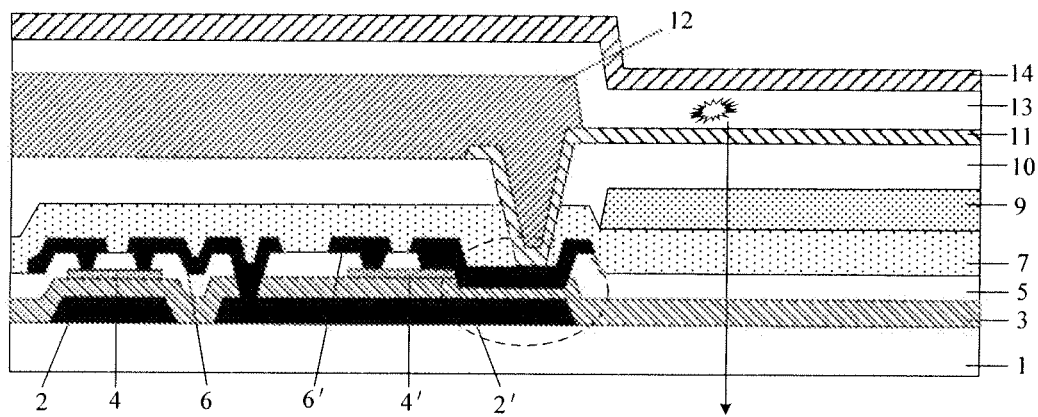
FIG. 3 is a schematic structural view of an array substrate provided by an embodiment of the present invention.

As illustrated in FIG. 3, the array substrate comprises (from bottom to top): a first gate electrode 2, a second gate electrode 2' and gate lines (not illustrated in the figure) formed on a substrate 1, a gate insulating layer 3 formed on the first gate electrode 2, the second gate electrode 2' and the gate lines, a first active layer 4 and a second active layer 4' formed on the gate insulating layer 3, an insulating interlayer 5 formed on the first active layer 4 and the second active layer 4', a first source-drain layer 6 (including a first source electrode and a first drain electrode) and a second source-drain layer 6' (including a second source electrode and a second drain electrode) formed on the insulating interlayer 5, and a passivation layer 7 formed on the first source-drain layer 6 and the second source-drain layer 6'. The first gate electrode 2, the gate insulating layer 3, the first active layer 4, the insulating interlayer 5 and the first source-drain layer 6 constitute a switch TFT. The second gate electrode 2', the gate insulating layer 3, the second active layer 4', the insulating interlayer 5 and the second source-drain layer 6' constitute a drive TFT. The passivation layer 7, a color filter 9, a resin layer 10, a first electrode 11 of an OLED, a pixel defining layer 12, an organic emission layer 13, and a second electrode 14 of the OLED are disposed on the first source-drain layer 6 and the second source-drain layer 6' in sequence. The first electrode 11 is a transparent electrode; and light emitted by the organic emission layer is emitted after running through the first electrode and various layers under the first electrode.

For instance, the color filter 9 is formed between a layer provided with the OLED and a layer provided with the TFT structure.

In the structure, the second gate electrode 2' and a drain electrode (hereinafter referred to as the second drain electrode) of the second source-drain layer 6' are at least partially overlapped to form a storage capacitor; and an insulating layer formed by the gate insulating layer 3 and the insulating interlayer 5 is interposed between the second gate electrode 2' and the second drain electrode. In order to increase the storage capacitance, a recess is formed in the insulating layer at position corresponding to the overlapped area and one part of the second drain electrode is formed in the recess, so that the distance between the second gate electrode 2' and the second drain electrode is less than the thickness of the insulating layer corresponding to the non-overlapped area. That is to say, compared to the traditional storage capacitor structure, the distance between two plate electrodes (the second gate electrode 2' and the second drain electrode) of the storage capacitor is reduced and the storage capacitance is increased.

Figure 4:
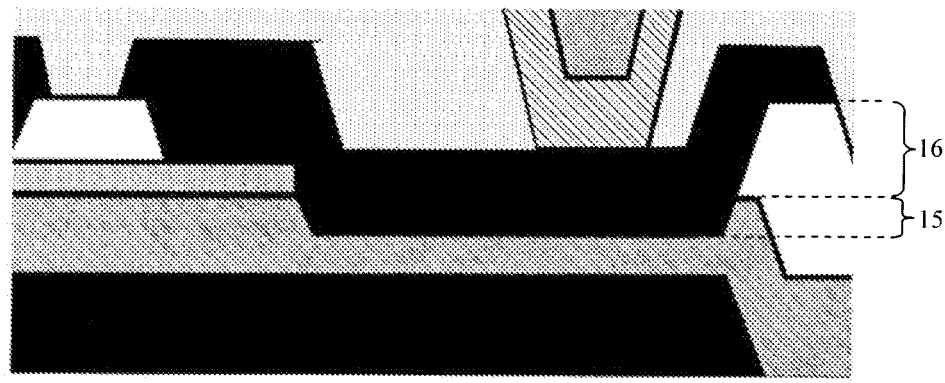
FIG. 4 is an enlarged view of a recess of the array substrate in FIG. 3.

In the embodiment, the insulating layer between the two plate electrodes of the storage capacitor consists of the gate insulating layer 3 and the insulating interlayer 5, and the recess has three structures:

Structure 1: the recess is formed on a surface of the insulating interlayer 5 close to the second drain electrode, and the depth of the recess is less than the thickness of the insulating interlayer 5, namely the recess is formed in the insulating interlayer 5;

Structure 2: a through hole is formed in the insulating interlayer 5 corresponding to the overlapped area, and the through hole and a surface of the gate insulating layer 3 form the recess; and Structure 3: as illustrated in FIG. 4, a through hole 16 is formed in the insulating interlayer 5 corresponding to the overlapped area; a sub-recess 15 is formed in the gate insulating layer 3 corresponding to the overlapped area; the through hole 16 and the sub-recess 15 form the recess. The depth of the sub-recess 15 is less than the thickness of the gate insulating layer 3.

In the three structures, as for the recess with the structure 3, the distance between the second gate electrode 2' and the second drain electrode is minimum, and the formed storage capacitance is maximum. The storage capacitance corresponding to the structure 2 is secondary. The storage capacitance corresponding to the structure 1 has the smallest increase.

The insulating layer between the two plate electrodes (the second gate electrode 2' and the second drain electrode) of the storage capacitor may also only include the gate insulating layer 3. At this point, only the recess is formed in the surface of the gate insulating layer 3, so that one part of the second drain electrode is formed in the recess.

Figure 5:
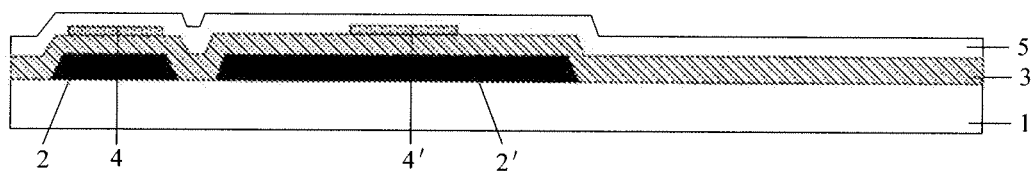
FIG. 5 is a schematic diagram of a substrate obtained by forming patterns of a gate electrode, an insulating layer and an active layer in manufacturing the array substrate in FIG. 3.

The embodiment of the present invention further provides a method for manufacturing the array substrate, which comprises:

Step 1: as illustrated in FIG. 5, forming patterns of a first gate electrode 2, a second gate electrode 2', an insulating layer, a first active layer 4 and a second active layer 4'. The insulating layer includes a gate insulating layer 3 and an insulating interlayer 5. The step is mainly as follows: corresponding film layers are formed (by coating, sputtering, deposition and the like), and hence patterns of the corresponding layers are formed by patterning process (the patterning process generally includes photoresist coating, exposure, development, etching, photoresist removing and the like). The step is basically the same with the step in the traditional method for manufacturing the array substrate, and will not be further described.

Figure 6:
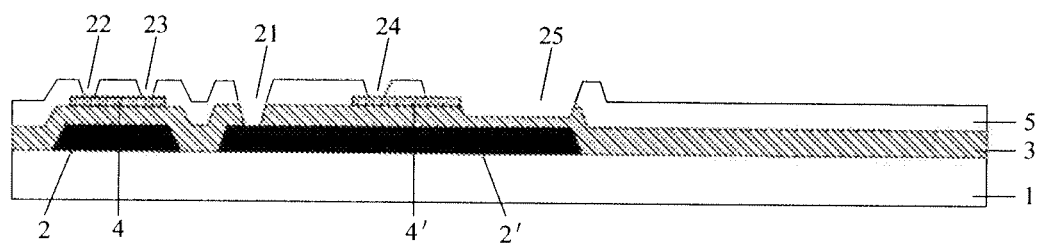
FIG. 6 is a schematic diagram of a substrate obtained by forming a through hole and a recess on the substrate in FIG. 5.

Step 2: forming patterns of a through hole and a recess in the insulating layer. More specifically, as illustrated in FIG. 6, by patterning process, a first through hole 21 running through the gate insulating layer and the insulating interlayer is formed at a connection area of the first drain electrode and the second gate electrode; a second through hole 22 running through the insulating interlayer is formed at a connection area of the first source electrode and the first active layer; a third through hole 23 running through the insulating interlayer is formed at a connection area of the first drain electrode and the first active layer; a fourth though hole 24 running through the insulating interlayer is formed at a connection area of the second source electrode and the second active layer; and a recess 25 is formed at an overlapped area of the second drain electrode and the second gate electrode. In the step, as the through holes have different depths, a half-tone mask may be adopted to achieve the development and exposure of photoresist. The through hole 21 is formed by a first etching process and then the through holes 22, 23 and 24 are formed by a second etching process. In addition, the recess 25 is also formed by the second etching process. The etching of the recess 25 includes the following three modes:

Mode 1: forming the recess 25 in the insulating interlayer 5 corresponding to the overlapped area. As the depth of the recess is preferably the same with that of the through holes 22, 23 and 24, the phenomenon of over-etching in the etching process of the recess 25 can be avoided.

Mode 2: forming the through hole in the insulating interlayer 5 corresponding to the overlapped area, and the through hole 16 (as illustrated in FIG. 4) and a surface of the gate insulating layer 3 forming the recess 25. In the mode, the overlapped area must be over-etched to form the recess 25.

Mode 3: forming the through hole 16 in the insulating interlayer 5 corresponding to the overlapped area, forming a sub-recess 15 (as illustrated in FIG. 4) in the gate insulating layer 3 corresponding to the overlapped area, and the through hole 16 and the sub-recess 15 forming the recess 25. The mode 3 is as illustrated in FIG. 6.

In the above three modes for forming the recess, the patterns of the through hole and the recess are formed in the insulating layer only by one patterning process no matter which mode is adopted.

Figure 7:
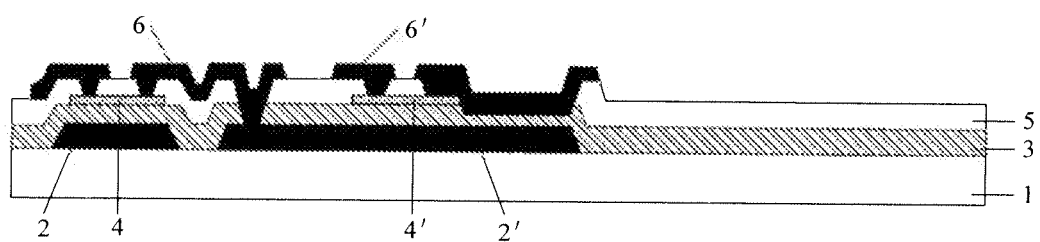
FIG. 7 is a schematic diagram of a substrate obtained by forming source/drain electrodes on the substrate in FIG. 6.

Step 3: as illustrated in FIG. 7, forming patterns of the first source-drain layer 6 (including the first source electrode and the first drain electrode) and the second source-drain layer 6' (including the second source electrode and the second drain electrode). The second drain electrode and the second gate electrode are at least partially overlapped, and one part of the second drain electrode is formed in the recess 25 (that is to say, the overlapped area of the second drain electrode and the second gate electrode corresponds to the recess 25), so that the distance between the second gate electrode and the second drain electrode is less than the thickness of the insulating layer corresponding to the non-overlapped area.

Step 4: forming patterns of a color filter and an OLED. The finally formed array substrate is as illustrated in FIG. 3.

If only the gate insulating layer 3 is formed in the step 1, in the step 2, the through hole is only formed in the gate insulating layer 3 at the connection area of the first drain electrode and the second gate electrode, and the recess is formed in the gate insulating layer at the overlapped area of the second drain electrode and the second gate electrode.

The embodiment of the present invention further provides an OLED display device, which comprises the foregoing array substrate. The display device may be electronic paper, an OLED panel, an OLED display, an OLED TV, a digital picture frame, a mobile phone, a tablet PC or any other product or component with display function.

The foregoing is merely exemplary embodiments of the invention, but is not used to limit the protection scope of the invention. The protection scope of the invention shall be defined by the attached claims.

What is claimed is:

1. An array substrate, comprising a plurality of pixel units disposed on a substrate, each pixel unit comprising a thin-film transistor (TFT) structure formed on the substrate and an organic light-emitting diode (OLED) driven by the TFT structure, the TFT structure comprising a drive TFT, wherein
    a drain electrode of the drive TFT is connected with the OLED; a gate electrode and the drain electrode of the drive TFT are at least partially overlapped to form a storage capacitor; and
    a recess is formed in an insulating layer interposed between the gate electrode and the drain electrode corresponding to an overlapped area of the gate electrode and the drain electrode of the drive TFT, so that a distance between the gate electrode and the drain electrode is less than a thickness of a part of the insulating layer in an area other than the non-overlapped area.

2. The array substrate according to claim 1, wherein the drain electrode is disposed over the gate electrode; and a part of the drain electrode is formed in the recess.

3. The array substrate according to claim 2, wherein the TFT structure comprises: a first gate electrode and a second gate electrode formed on the substrate, a gate insulating layer formed on the first gate electrode and the second gate electrode, a first active layer and a second active layer formed on the gate insulating layer, a first source electrode and a first drain electrode formed on the first active layer, and a second source electrode and a second drain electrode formed on the second active layer; the first drain electrode is connected with the second gate electrode; the first gate electrode, the gate insulating layer, the first active layer, the first source electrode and the first drain electrode constitute a switch TFT; and the second gate electrode, the gate insulating layer, the second active layer, the second source electrode and the second drain electrode constitute the drive TFT; and
    the OLED is disposed in a pixel region of the pixel unit and comprises a transparent first electrode, an emission layer and a second electrode; the first electrode is connected with the second drain electrode; the second drain electrode and the second gate electrode are at least partially overlapped to form the storage capacitor; and the insulating layer interposed between the second drain electrode and the second gate electrode comprises the gate insulating layer.

4. The array substrate according to claim 3, wherein an insulating interlayer is further formed between the second active layer and the second drain electrode; the insulating layer comprises the insulating interlayer and the gate insulating layer; the recess is formed in a surface of the insulating interlayer close to the second drain electrode; and the depth of the recess is less than the thickness of the insulating interlayer.

5. The array substrate according to claim 3, wherein an insulating interlayer is further formed between the second active layer and the second drain electrode; the insulating layer comprises the insulating interlayer and the gate insulating layer; a through hole is formed in the insulating interlayer corresponding to the overlapped area; and the through hole and a surface of the gate insulating layer form the recess.

6. The array substrate according to claim 3, wherein an insulating interlayer is further formed between the second active layer and the second drain electrode; the insulating layer comprises the insulating interlayer and the gate insulating layer; a through hole is formed in the insulating interlayer corresponding to the overlapped area; a sub-recess is formed in the gate insulating layer corresponding to the overlapped area; the through hole and the sub-recess form the recess; and the depth of the sub-recess is less than the thickness of the gate insulating layer.

7. The array substrate according to claim 1, wherein the TFT structure comprises: a first gate electrode and a second gate electrode formed on the substrate, a gate insulating layer formed on the first gate electrode and the second gate electrode, a first active layer and a second active layer formed on the gate insulating layer, a first source electrode and a first drain electrode formed on the first active layer, and a second source electrode and a second drain electrode formed on the second active layer; the first drain electrode is connected with the second gate electrode; the first gate electrode, the gate insulating layer, the first active layer, the first source electrode and the first drain electrode constitute a switch TFT; and the second gate electrode, the gate insulating layer, the second active layer, the second source electrode and the second drain electrode constitute the drive TFT; and
    the OLED is disposed in a pixel region of the pixel unit and comprises a transparent first electrode, an emission layer and a second electrode; the first electrode is connected with the second drain electrode; the second drain electrode and the second gate electrode are at least partially overlapped to form the storage capacitor; and the insulating layer interposed between the second drain electrode and the second gate electrode comprises the gate insulating layer.

8. The array substrate according to claim 7, wherein an insulating interlayer is further formed between the second active layer and the second drain electrode; the insulating layer comprises the insulating interlayer and the gate insulating layer; the recess is formed in a surface of the insulating interlayer close to the second drain electrode; and the depth of the recess is less than the thickness of the insulating interlayer.

9. The array substrate according to claim 7, wherein an insulating interlayer is further formed between the second active layer and the second drain electrode; the insulating layer comprises the insulating interlayer and the gate insulating layer; a through hole is formed in the insulating interlayer corresponding to the overlapped area; and the through hole and a surface of the gate insulating layer form the recess.

10. The array substrate according to claim 7, wherein an insulating interlayer is further formed between the second active layer and the second drain electrode; the insulating layer comprises the insulating interlayer and the gate insulating layer; a through hole is formed in the insulating interlayer corresponding to the overlapped area; a sub-recess is formed in the gate insulating layer corresponding to the overlapped area; the through hole and the sub-recess form the recess; and the depth of the sub-recess is less than the thickness of the gate insulating layer.

11. The array substrate according to claim 1, wherein the pixel unit further comprises: a color filter formed between a layer provided with the OLED and a layer provided with the TFT structure.

12. The array substrate according to claim 11, wherein the color filter is disposed on a passivation layer above the drive TFT.

13. An OLED display device, comprising the array substrate according to claim 1.

14. The OLED display device according to claim 13, wherein the drain electrode is disposed over the gate electrode; and a part of the drain electrode is formed in the recess.

15. The OLED display device according to claim 13, wherein the TFT structure comprises: a first gate electrode and a second gate electrode formed on the substrate, a gate insulating layer formed on the first gate electrode and the second gate electrode, a first active layer and a second active layer formed on the gate insulating layer, a first source electrode and a first drain electrode formed on the first active layer, and a second source electrode and a second drain electrode formed on the second active layer; the first drain electrode is connected with the second gate electrode; the first gate electrode, the gate insulating layer, the first active layer, the first source electrode and the first drain electrode constitute a switch TFT; and the second gate electrode, the gate insulating layer, the second active layer, the second source electrode and the second drain electrode constitute the drive TFT; and the OLED is disposed in a pixel region of the pixel unit and comprises a transparent first electrode, an emission layer and a second electrode; the first electrode is connected with the second drain electrode; the second drain electrode and the second gate electrode are at least partially overlapped to form the storage capacitor; and the insulating layer interposed between the second drain electrode and the second gate electrode comprises the gate insulating layer.

* * * * *